United States Patent
Loibl et al.

(10) Patent No.: US 8,089,773 B2
(45) Date of Patent: Jan. 3, 2012

(54) ELECTRONICS HOUSING WITH OPEN CONDUCTOR TRACK REGIONS AND A CONTACT PARTNER FORMED AS A CLIP

(75) Inventors: Joseph Loibl, Bad Abbach (DE); Karl Smirra, Wasserburg (DE)

(73) Assignee: Continental Automotive GmbH, Hannover (DE)

( * ) Notice: Subject to any disclaimer, the term of this patent is extended or adjusted under 35 U.S.C. 154(b) by 270 days.

(21) Appl. No.: 12/514,083

(22) PCT Filed: Oct. 22, 2007

(86) PCT No.: PCT/EP2007/061252
§ 371 (c)(1),
(2), (4) Date: May 8, 2009

(87) PCT Pub. No.: WO2008/058825
PCT Pub. Date: May 22, 2008

(65) Prior Publication Data
US 2010/0002403 A1    Jan. 7, 2010

(30) Foreign Application Priority Data
Nov. 13, 2006  (DE) .......................... 10 2006 053 407

(51) Int. Cl.
*H05K 7/02* (2006.01)
*H05K 7/10* (2006.01)

(52) U.S. Cl. ........................................................ 361/752

(58) Field of Classification Search .................... 439/67, 439/34, 69, 525; 361/749–752
See application file for complete search history.

(56) References Cited

U.S. PATENT DOCUMENTS

| 3,149,896 A | 9/1964 | Hall |
| 5,418,685 A * | 5/1995 | Hussmann et al. ........... 361/719 |
| 6,392,148 B1 | 5/2002 | Ueno et al. |
| 6,533,620 B2 * | 3/2003 | Franzen et al. ............... 439/876 |
| 6,778,401 B1 * | 8/2004 | Yu et al. ........................ 361/752 |
| 6,919,529 B2 * | 7/2005 | Franzen et al. .......... 219/121.64 |
| 6,932,635 B2 * | 8/2005 | Ishikawa et al. .............. 439/190 |
| 7,021,971 B2 * | 4/2006 | Chou et al. .................... 439/660 |
| 7,104,848 B1 * | 9/2006 | Chou et al. .................... 439/660 |

(Continued)

FOREIGN PATENT DOCUMENTS

DE    102004036683 A1    3/2006

(Continued)

OTHER PUBLICATIONS

German Office Action dated Aug. 29, 2007.

(Continued)

*Primary Examiner* — Chandrika Prasad
(74) *Attorney, Agent, or Firm* — Laurence A. Greenberg; Werner H. Stemer; Ralph E. Locher

(57) ABSTRACT

A housing for an electronic control unit has at least two housing parts which include at least a housing base, a housing cover and an electronic connection between components which are disposed inside the housing and components which are outside the housing. The connection is fixed to the housing base. The electronic connection has open conductor track regions outside the housing cover. The regions are at least partially covered by one or more contact partners. In this case, the contact partners simultaneously have at least one direct contact-connection to one or more of the open conductor track regions.

2 Claims, 3 Drawing Sheets

U.S. PATENT DOCUMENTS

| | | |
|---|---|---|
| 7,142,433 B2 | 11/2006 | Lechner |
| 7,144,256 B2 * | 12/2006 | Pabst et al. ............... 439/67 |
| 7,259,967 B2 * | 8/2007 | Ni ............................. 361/760 |
| 7,359,208 B2 * | 4/2008 | Ni ............................. 361/752 |
| 7,440,287 B1 * | 10/2008 | Ni et al. .................... 361/752 |
| 7,724,530 B2 * | 5/2010 | Clayton et al. ............ 361/749 |
| 2002/0109264 A1 | 8/2002 | Lechner |
| 2003/0114022 A1 | 6/2003 | Franzen et al. |
| 2004/0080917 A1 | 4/2004 | Steddom et al. |
| 2009/0002959 A1 | 1/2009 | Loibl et al. |
| 2009/0053943 A1 | 2/2009 | Fink et al. |

FOREIGN PATENT DOCUMENTS

| | | |
|---|---|---|
| DE | 102004050687 A1 | 4/2006 |
| DE | 102005005705 A1 | 8/2006 |
| DE | 102005009443 A1 | 9/2006 |
| EP | 1231824 A2 | 8/2002 |
| WO | 9844593 A1 | 10/1998 |
| WO | 0211502 A1 | 2/2002 |

OTHER PUBLICATIONS

International Search Report dated Feb. 27, 2008.

* cited by examiner

ELECTRONICS HOUSING WITH OPEN CONDUCTOR TRACK REGIONS AND A CONTACT PARTNER FORMED AS A CLIP

BACKGROUND OF THE INVENTION

1. Field of the Invention

The invention relates to a standardized electronics housing having at least two housing parts including at least one housing base, a housing cover and at least one electronic connection, fixed to the housing base, in the form of a printed circuit board between components disposed in the interior of the housing and components located outside the housing, and a method for producing such a control device, in particular for transmission or engine controllers in the automobile industry.

2. Prior Art

In motor vehicle engineering components such as transmission, engine and braking systems are increasingly controlled in a predominantly electronic fashion. There is a trend here toward mechatronic controllers, in other words integrating electronic control systems and their associated electronic components, such as sensors or valves, in the transmission system, engine, braking system, etc. The control devices generally have a plurality of electronic components, which are connected to other components outside the control device. With such integrated electronics systems these controllers are no longer housed in a special, protected electronics chamber. They therefore have to withstand corresponding environmental influences and mechanical, thermal and chemical stresses.

To this end they are generally inserted into special housings. The housings also have an important shielding function. An electrical connection from the inside of the housing to the outside of the housing is required to allow reliable connection to components outside the housing.

Systems are known, in which the central electronics system is brought into electrical contact with a general component support in the housing. The general component support is a customized connection between all the components outside the control device and the central electronics system. However this arrangement therefore has the disadvantage that it is not possible to interface individual peripheral components with the central electronics system in a flexible manner. Also the general component support must be redeveloped and redesigned for the respective application and associated specific requirements. This is associated with a considerable time and cost outlay.

One design for making the connection between peripheral components and a central electronics system more flexible is known from DE 10 2004 036 683 A1. Here an arrangement is described for the electrical connection of an electronic control system to peripheral components, such as sensors, valves or plug connectors, by establishing contact with flexible printed circuit board parts.

Reference is made by way of example to DE 10 2004 050 687 A1 for generic contacting. This indicates a possibility for the direct contacting of a cable or cable bundle engaging with a flexible printed circuit board.

However this also has the disadvantage that an individually tailored layout customized for the relevant components has to be produced for the housing and the geometry of the flexible printed circuit boards for every control device. If the prerequisites for the contacting of the peripheral components or even the size and geometry of the central electronics substrate change, a new layout has to be found and produced for the housing and the flexible printed circuit boards. This is necessary regardless of whether the flexible printed circuit boards are configured as a single piece or as parts.

BRIEF SUMMARY OF THE INVENTION

The object of the invention is therefore to provide a standardized electronics housing, which allows simple, reliable and flexible interfacing of functional peripheral components, such as sensors, satellites and external plug connectors. The intention is therefore to provide a design for a standardized, in particular a modularized, contacting or peripheral components with an electronics housing.

According to the invention this is achieved with an apparatus in which the electronic connection has open conductor track regions outside the housing cover, which are covered at least partially by one or more contact partners, and the contact partners at the same time having at least one direct contact with one or more open conductor track regions, and a method for producing such an apparatus in which at least one electronic connection is positioned on the housing base, is connected to the electronics substrate inside the housing, the housing cover is secured and the components outside the housing are interfaced at least partially by the contact partners.

The invention proposes that the electronic connection has standard, open conductor track regions outside the housing cover, which are covered at least partially by contact partners. At the same time the contact partners have at least one direct contact with one or more peripheral components. The inventive contact partner therefore combines two different functions of covering and contacting, which were previously the tasks of separate modules. This combining of functionalities also allows contact with the central electronics systems of integrated mechatronic systems to be standardized. It is thus possible for the first time to provide predetermined module contact partners for the individual types of components. This not only allows optimal routing of the signal and current paths, it also enables flexible tailoring to different arrangements, functionalities and geometries of the peripheral components, such as sensors, valves, etc.

Further advantageous embodiments and developments, which can be deployed individually or in combination, are the subject matter of the dependent claims.

In one preferred embodiment of the invention a contact partner can have one or more integrated electrical interfaces with one or more peripheral components. The integrated interfaces can preferably be configured as cable ends, stamped grids or plug connectors.

The contact partner can thus be designed in a customized manner for the respective type of peripheral component, to which a connection is to be established with the central electronics system. The invention thus enables a modular system of different contact partners to be achieved, allowing considerably greater flexibility of the housing structure and at the same time considerable cost reduction due to the standardized production.

The contact partner can also preferably be a support for one of more peripheral components at the same time. This has the advantage that further shortening and routing of the signal and current paths is possible. Also this compact composition and structure of the central electronics system on the one hand and of the associated peripheral components on the other hand significantly reduces susceptibility to error and breakdown.

In another preferred embodiment of the invention the contact partners overlap with the edge of the housing cover. It is thus possible to achieve a sealed covering, for example also in the manner of a labyrinth sealing path, as protection from chips and against further contamination due to environmental influences. The contact partners can advantageously cover the open conductor track regions completely and therefore replace a contact cover that would otherwise be required.

Alternatively the contact partners can be configured in such a manner that they terminate flush with the edge of the housing cover and thus ensure that the open conductor track regions are covered and sealed against chips. The twin function of the contact partners is thus able to achieve considerable material and cost savings.

The connections between the electronic components outside the housing and the preferably standardized contact partner of the present invention can be established in any known manner. The form of connection with the integrated interface of the contact partner is preferably designed specifically for a peripheral component.

Flexible printed circuit boards are used as the electronic connection in electronically controlled systems and are in particular are also preferred according to the invention. They are particularly suitable for use where there are stringent mechanical and thermal requirements, as is the case with engine and transmission controllers for motor vehicles. Their flexible design allows simple customization for different electrical modules and/or electronic control systems.

According to the invention the electronic connection can also be a multilayer flexible printed circuit board, which by definition has two or more conductor track levels separated by insulating layers.

In one particularly preferred embodiment of the inventive housing the electronic connection is formed from at least two or more flexible partial printed circuit boards. This allows both greater flexibility in the configuration of the individual partial printed circuit boards and therefore also optimum benefit utilization and also further routing of signal and current paths. This variant also satisfies the further advantageous prerequisite of keeping the overall area of the flexible printed circuit boards per se small, for cost reasons in particular. Use of the relatively expensive areas of the flexible printed circuit boards and disposal can be kept to a minimum.

The flexible printed circuit board can consist for example of a lower polyimide base film, a metallic conductor track, preferably made of copper, embedded in an adhesive layer and disposed thereon, and a polyimide top film. Further, preferably more cost-effective, materials can also be used both for the base film and for the adhesive layer. To reduce costs therefore materials can be provided, which can be applied using an injection, varnishing or screen printing method. It is also possible to vary the layer thickness of the individual layers.

To allow subsequent positioning of the housing cover, it is possible to provide a peripheral recess to accommodate a seal or sealing material. Alternatively or additionally the housing cover can also be connected to the base plate and/or the flexible printed circuit board by riveting, adhesion or soldering. The most important thing here is to provide a good seal, should the electronic components be used later in an aggressive environment, as for example in a transmission system or an engine.

If the housing cover is secured by soldering, an uninterrupted peripheral metallic track is first disposed on the surface of the flexible printed circuit board. This metallic region preferably forms the receiving area for the housing cover.

The housing base is preferably made of a metallic material, particularly preferably aluminum. In one preferred embodiment of the invention the flexible printed circuit board is laminated onto the metallic housing base. This ensures a reliable, leaktight and cost-effective fixing. The housing cover can be made of any material, which ensures that the electronics system is adequately protected against prevailing environmental influences. As well as housing covers made of plastic, those made of metallic materials can also be used. If the housing cover is to be fixed by soldering, a housing cover made of metal should preferably be provided. This has both the necessary EMC shielding values and also a greater rigidity. Alternatively a metal-coated plastic molded body can also be used. In one advantageous embodiment however the housing cover is made of a metallic material, such as sheet steel or die-cast metal for example. This provides greater long-term stability, a good diffusion density in respect of aggressive chemicals and improved shielding values over the entire service life of the control device. In a further embodiment the housing base can have a bigger base area than the housing cover.

To produce an inventive housing for a control device, a single-piece flexible printed circuit board or one or more flexible partial printed circuit boards are positioned on the housing base, having at least one open region of the copper conductor track according to the invention. Contact is established with the electronic components inside the housing and the housing cover is then positioned on the corresponding region of the electronic connection and fixed there. The open regions of the flexible printed circuit board with the subsequently established contacts are preferably covered and protected against external influences by the inventive contact partners. Such external influences can include for example metallic chips from manufacturing residues of the transmission or engine housing, which could result in short circuits of the contacts or the open regions of the copper conductor tracks.

According to the present invention a flexible printed circuit board or a number of flexible partial printed circuit boards is/are laminated onto a housing base, which is preferably made of aluminum. The flexible printed circuit board is particularly preferably fixed to the housing base using acrylic adhesive.

BRIEF DESCRIPTION OF THE SEVERAL VIEWS OF THE DRAWING

The invention is described below by way of example with reference to a variant in conjunction with the drawings, in which.

DESCRIPTION OF THE INVENTION

Figure 1:
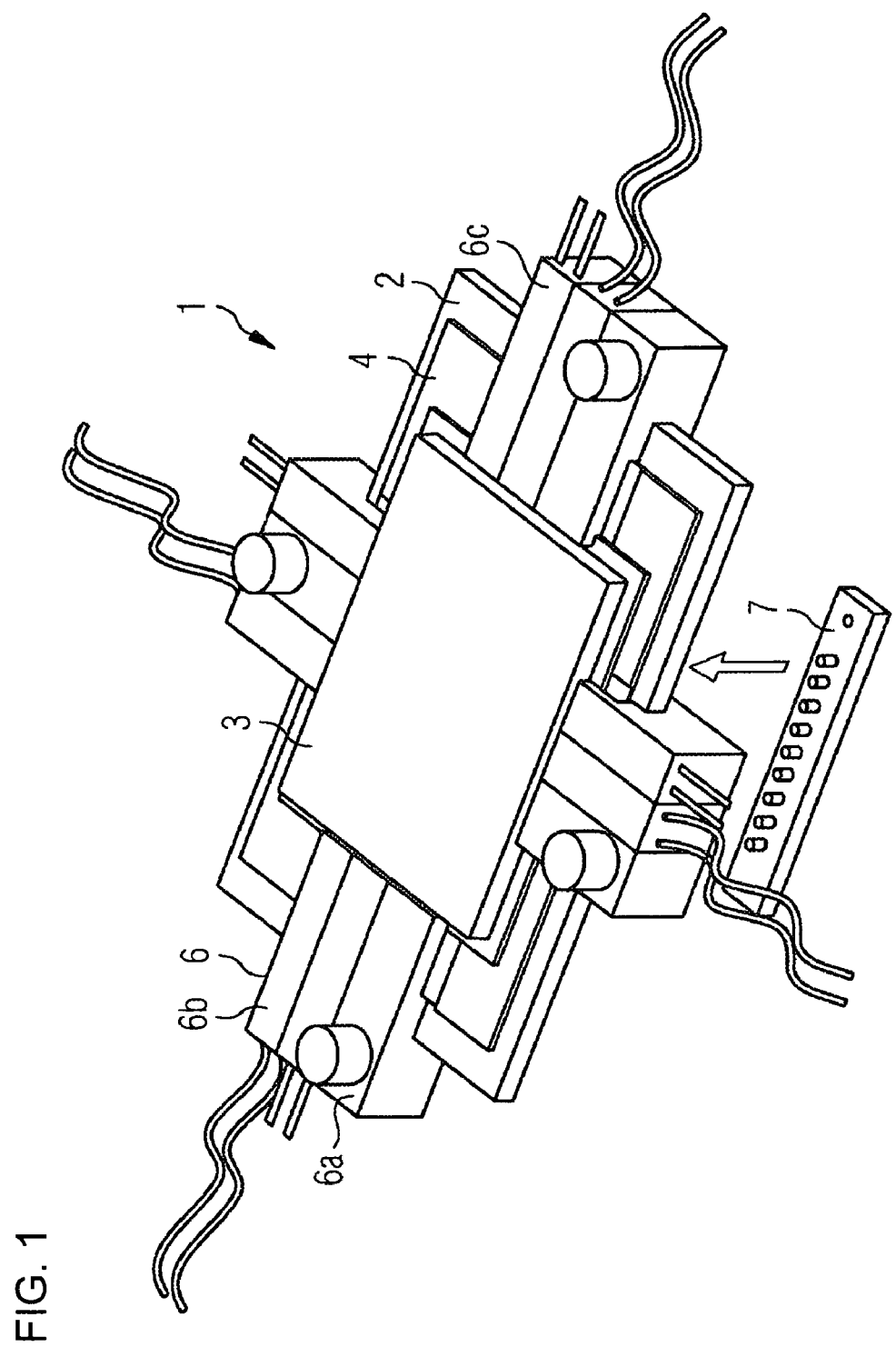
FIG. 1 shows a perspective plan view of the closed electronics housing with 12 peripheral components.

FIG. 1 shows an inventive electronics housing 1, which is provided for integration into a motor vehicle transmission system. The housing 1 is formed by a metallic base plate 2 and a housing cover 3 made of sheet steel. A flexible printed circuit board 4 is fixed to the metallic base plate 2. The housing cover 3 can be made of plastic, metal or composite materials and is preferably connected to the printed circuit board in a hermetically sealed manner. Inside the housing is an electronics substrate 5 (not shown). In this embodiment three contact partners 6 respectively for a peripheral component with different functionalities are disposed on each side of the housing 1. A sensor element 6a, which is particularly preferably disposed directly on the contact partner 6, a cable connection 6b and a stamped grid (plug connector) 6c are shown by way of example as integrated interfaces for a peripheral component. The inventive contact partners 6 are respectively connected to the housing 1 in such a manner that an interface and electrical contact are established with the open Cu zones 8 of the flexible printed circuit board 4. The embodiment and interfacing of the contact partners 6 is advantageously tailored so that the open conductor track regions 8 of the flexible printed circuit board 4 are covered completely and at least in a manner that protects from chips. There is thus no need for an additional contact cover above the printed circuit board 4. Additional contact covers 7 can optionally be provided, as shown separately, as protection from chips and as protection against other environmental influences.

Figure 2:
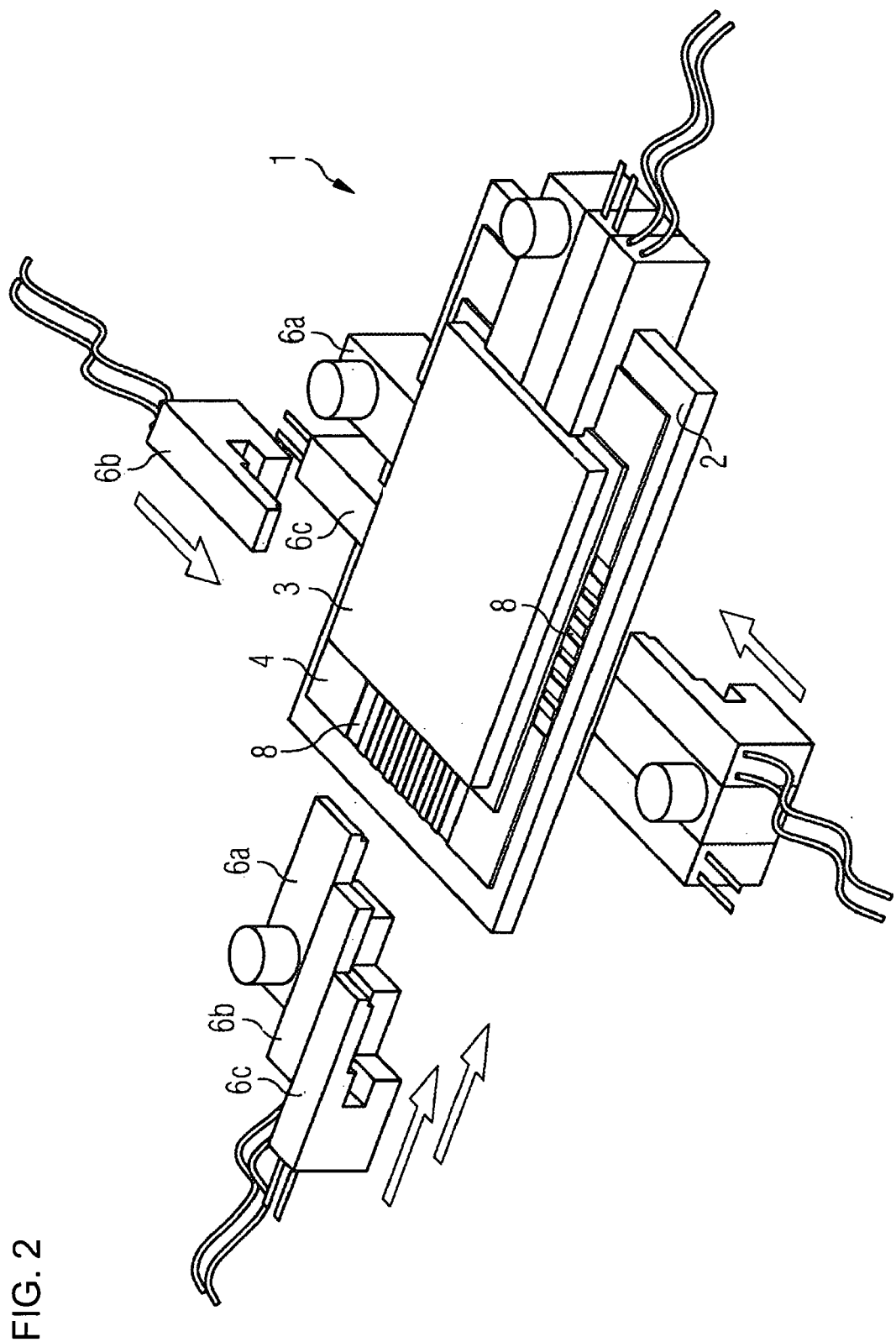
FIG. 2 shows a partially exploded plan view of the electronics housing in FIG. 1.

FIG. 2 shows a partially exploded view of the electronics housing from FIG. 1. The base plate 2 supports the flexible printed circuit board 4, with the housing cover 3 being disposed in a fixed manner peripherally, preferably in such a manner as to provide a hermetic seal, directly on the flexible printed circuit board 4. The flexible printed circuit board 4 has a larger area than the housing cover 3 and projects below the receiving area of the cover 3. In the diagram the base plate 2 in turn has a larger area than the flexible printed circuit board 4. In alternative embodiments of the invention it is however possible without further ado for the flexible printed circuit board 4 to project wholly or partially over the base plate 2. The open Cu zones 8 of the flexible printed circuit board 4 as contact points are disposed outside the housing cover 3 in the peripheral region of the printed circuit board 4. In the diagram on one side of the printed circuit board 4 the open contact points 8 are connected to the inventive contact partners 6 and covered by these. On the other sides arrows show the arrangement for the interfacing of the still unattached contact partners 6 with the housing 1. For example the contact partners 6 can be positioned on the central housing unit 1 in a form-fit manner. A mechanical holding and/or securing means can also be provided here, for example a clip mechanism. The contact partners 6 can be embodied as already connected to one another and therefore a single piece or can be connected to the housing 1 as individual modules. The contact partners 6 can be interfaced in any order. It is thus possible to ensure optimal routing of the signal and current paths.

Figure 3:
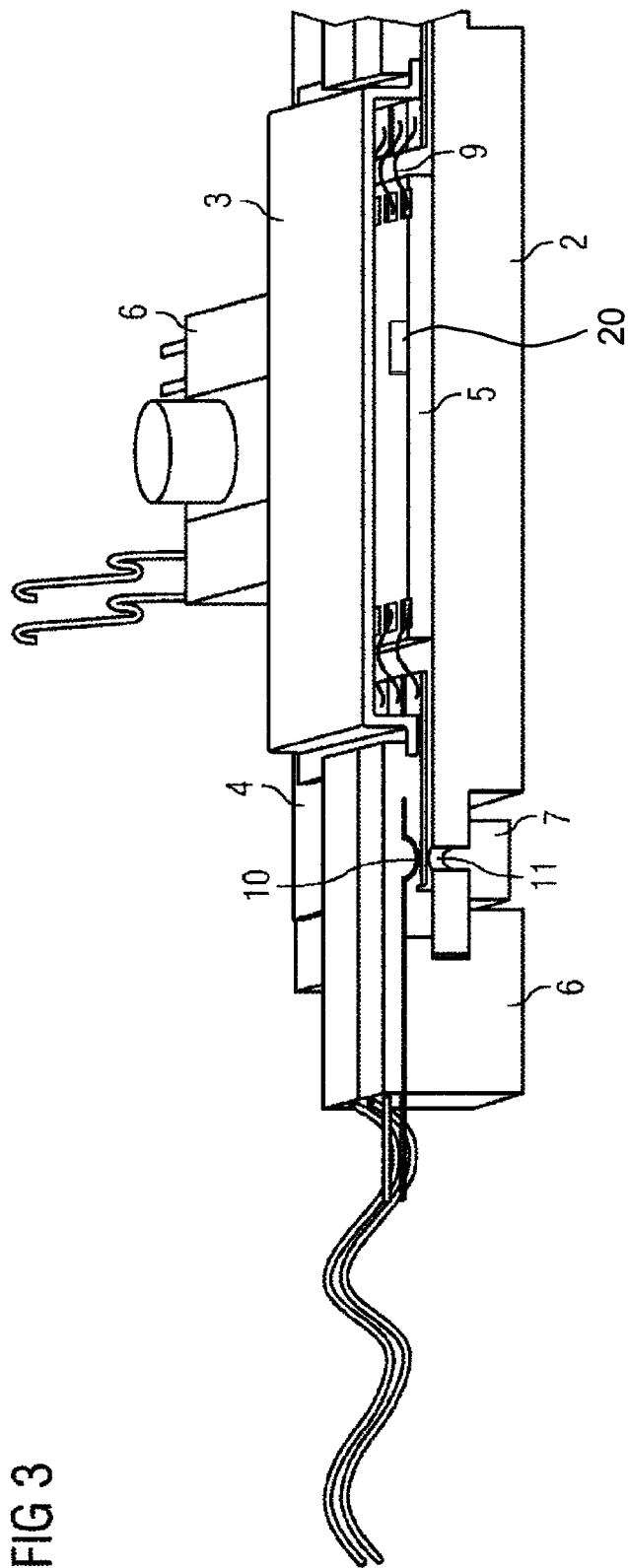
FIG. 3 shows a sectional diagram of a partial section of the electronics housing and the contact region.

FIG. 3 shows a sectional diagram of the structure of the housing 1 from FIGS. 1 and 2 with interfaced contact partners 6. The housing 1 is formed by a metallic base plate 2 made of aluminum and a housing cover 3 made of sheet steel. A flexible printed circuit board 4 is fixed to the metallic base plate 2. The housing cover 3 is disposed in a fixed manner peripherally, preferably in such a manner as to provide a hermetic seal, directly on the flexible printed circuit board 4. Inside the housing is an electronics substrate 5. The flexible printed circuit board 4 shown is also cut out in the inner region of the housing and the electronics substrate 5, which has electronic components 20, is disposed in the resulting cutout. The connections between the electronics substrate 5 and the flexible printed circuit board 4 are established by means of thick wire bonding 9. The electrical contact 10 with the inventive contact partners 6 can be established for example by laser welding, soldering, crimping or bonding. The contact cover 7 is fixed to the base plate 2 of the electronics housing 1 using securing means. According to the present preferred embodiment of the invention the housing base 2 has a notch 11 in the region of the contact point 10 with the contact partners 6, said notch 11 being closed off here by a cover 7 projecting into it.

The invention claimed is:

1. An electronics housing comprising:
    at least two housing parts including at least one housing base and a housing cover defining a housing interior for components; and
    at least one electronic connection in the form of a printed circuit board fixed to said housing base between the components disposed in said housing interior and components located outside the housing, said electronic connection having open conductor track regions outside said housing cover; and
    at least one contact partner at least partially covering said open conductor track regions, said at least one contact partner also having at least one direct contact with at least one of said open conductor track regions;
    wherein said at least one contact partner is formed as a clip that is secured onto said housing base.

2. The electronics housing according to claim 1, wherein said housing base has opposite sides and said at least one contact partner is clipped onto both of said opposite sides of said housing base.

* * * * *